United States Patent
Kim

(10) Patent No.: US 6,200,849 B1
(45) Date of Patent: Mar. 13, 2001

(54) METHODS OF FABRICATING CONDUCTIVE CONTACTS FOR INTEGRATED CIRCUIT MEMORY DEVICES USING FIRST AND SECOND DIELECTRIC LAYERS AND FIRST AND SECOND CONDUCTIVE LAYERS

(75) Inventor: Yun Gi Kim, Kangwon-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/378,333

(22) Filed: Aug. 20, 1999

(30) Foreign Application Priority Data

Sep. 29, 1998 (KR) .................................................. 98-40423

(51) Int. Cl.⁷ ............................................... H01L 21/8242

(52) U.S. Cl. ............................ 438/241; 438/629; 438/639

(58) Field of Search ..................................... 438/239, 629, 438/639, 672, 664, FOR 352, FOR 355, FOR 212, FOR 216, FOR 196, 241, 643

(56) References Cited

U.S. PATENT DOCUMENTS

| | | | |
|---|---|---|---|
| 5,252,517 | * 10/1993 | Blalock et al. . | |
| 5,268,333 | 12/1993 | Lee et al. | 437/235 |
| 5,516,625 | 5/1996 | McNamara et al. | 430/314 |
| 5,532,191 | 7/1996 | Nakano et al. | 437/228 |
| 5,677,557 | 10/1997 | Wuu et al. | 257/382 |
| 5,851,874 | 12/1998 | Kuo et al. | 438/253 |
| 5,854,119 | * 12/1998 | Wu et al. . | |
| 5,879,986 | * 3/1999 | Sung . | |
| 6,060,351 | * 5/2000 | Parekh et al. . | |

OTHER PUBLICATIONS

The National Technology Roadmap for Semiconductors: Technology Needs, Semiconductor Industry Association (SIA), 1997, pp. 99–113.

* cited by examiner

Primary Examiner—George Fourson
Assistant Examiner—Joannie A. Garcia
(74) Attorney, Agent, or Firm—Myers Bigel Sibley & Sajovec

(57) ABSTRACT

Contacts to a cell area and to a core area of integrated circuit memory devices are fabricated by forming a first interlayer dielectric layer on the cell area and on the core area, including on a plurality of spaced apart insulated gates in the cell area. The first interlayer dielectric layer includes therein a plurality of first contact holes having sidewalls that extend from a face of the first interlayer dielectric layer through the first interlayer dielectric layer. The first contact holes further extend between the plurality of spaced apart insulated gates. A first recessed conductive layer is formed in the plurality of first contact holes, between the plurality of spaced apart insulating gates, and recessed beneath the face of the first interlayer dielectric layer. A second dielectric layer then is conformally formed on the face of the first dielectric layer, on the sidewalls of the first contact holes and on the first recessed conductive layer in the first contact holes. At least a portion of the second dielectric layer is removed from on the first recessed conductive layer. A second conductive layer is formed in the first contact holes between the second dielectric layer on the sidewalls of the first contact holes. Thus, high aspect ratio contacts to the cell area may be provided. Second contact holes then may be formed in the core area, extending through the second dielectric layer and the first dielectric layer. A third conductive layer then may be conformally formed on the second dielectric layer, on the second conductive layer and lining the second contact holes. Thus, conductive contacts for the core area and the cell area may be formed simultaneously.

12 Claims, 9 Drawing Sheets

METHODS OF FABRICATING CONDUCTIVE CONTACTS FOR INTEGRATED CIRCUIT MEMORY DEVICES USING FIRST AND SECOND DIELECTRIC LAYERS AND FIRST AND SECOND CONDUCTIVE LAYERS

FIELD OF THE INVENTION

This invention relates to integrated circuit memory devices and fabrication methods therefor, and more particularly to contacts for integrated circuit memory devices and fabrication methods therefor.

BACKGROUND OF THE INVENTION

Integrated circuit memory devices, such as Dynamic Random Access Memory (DRAM) devices are widely used in consumer and commercial products. As is well known to those having skill in the art, integrated circuit memory devices generally include a cell area containing a large array of integrated circuit memory cells and a core area containing peripheral circuits that are used to control the integrated circuit memory cells.

As the integration density of integrated circuit memory devices continues to increase it may become increasingly difficult to provide conductive contacts to the cell area and to the core area of integrated circuit memory devices. More particularly, as is well known to those having skill in the art, integrated circuit memory devices include conductive wiring layers and interconnections that are separated by dielectric layers that overlie an integrated circuit memory substrate. It is generally desirable to provide selective electric contacts from upper level wiring layers to active regions in the integrated circuit substrate, including but not limited to source and drain regions of field effect transistors that comprise the memory cell array and the core circuits.

As the integration density of integrated circuits continues to increase the topology of integrated circuit memory devices may become more nonuniform and the aspect ratio of the contact holes may become larger.

As to topology, the multiple levels of insulating layers and conductive wiring layers in high density memory devices may make the surface of the memory device nonplanar, and thereby create large topography differences in the device. Thus, it is known that the height of the cell area may differ from that of the core area by more than 2 $\mu$m, for example due to the presence of a stacked cell capacitor over the bit lines in the cell area.

Moreover, as the number of insulating layers and wiring layers continues to increase and the size of the active devices such as transistors continues to decrease, the aspect ratio of the contact holes may continue to increase. For example, a technical report entitled *The National Technology Roadmap for Semiconductors*, published in 1997 by the Semiconductor Industry Association (SIA), discloses that the aspect ratio of a 0.1 $\mu$m process may be as much 9:1, while the aspect ratio of a 0.35 $\mu$m process may only be approximately 4.5:1. Since the ground rules for 256 MB DRAMs have now been reduced down to about 0.2 $\mu$m, the aspect ratio of the contact holes may be quite large.

Many attempts have been made to overcome the problems of nonuniform topologies and high aspect ratios. For example, photoresist reflow processes may be used to planarize an integrated circuit substrate and reduce the topological differences thereon. See. for example, U.S. Pat. No. 5,616,625 to McNamara et al., U.S. Pat. No. 5,268,333 to Lee et al.; and U.S. Pat. No. 5,851,874 to Kuo et al. Another attempt to planarize the surface of integrated circuit devices is described in U.S. Pat. No. 5,532,191 to Nakano et al., wherein Chemical Mechanical Polishing (CMP) is used for planarization. Unfortunately, photoresist reflow processes and CMP may not be able to fully planarize the topography of integrated circuit memory devices, or may introduce problems of their own.

Attempts also have been made to form high aspect ratio contacts for integrated circuit memory devices. See, for example, U.S. Pat. No. 5,677,557 to Wuu et al. Unfortunately, these processes may be complicated and it may be difficult to integrate the formation of conductive contacts in the cell area and in the core area of integrated circuit memory devices. Specifically, separate two-step processes may be employed for making conductive contacts in the cell area and in the core area. Direct contacts to the cell area and the core area of an integrated circuit memory device may be formed separately by exposing and processing the contacts for the cell area and the core area separately. Accordingly, there continues to be a need for methods and structures that can provide conductive contacts to a cell area and to a core area of an integrated circuit memory device, that can provide reduced topology and/or that can accommodate high aspect ratios.

SUMMARY OF THE INVENTION

It is therefore an object of the present invention to provide improved methods of fabricating conductive contacts for integrated circuit memory devices and integrated circuit memory devices so fabricated.

It is another object of the present invention to provide methods of fabricating conductive contacts to a cell area and to a core area of integrated circuit memory devices wherein the contacts may be formed simultaneously, notwithstanding a large topology difference between the cell area and the core area.

It is another object of the present invention to provide contact fabrication methods and contacts so fabricated that can reduce the photolithographic requirements for forming a contact in a cell area, to thereby allow formation of high aspect ratio conductive contacts.

These and other objects are provided, according to the present invention, by methods of fabricating conductive contacts to a cell area and to a core area of integrated circuit memory devices, by forming a first interlayer dielectric layer on the cell area and on the core area, including on a plurality of spaced apart insulated gates in the cell area. The first interlayer dielectric layer includes therein a plurality of first contact holes having sidewalls that extend from a face of the first interlayer dielectric layer through the first interlayer dielectric layer. The first contact holes further extend between the plurality of spaced apart insulated gates. A first recessed conductive layer is formed in the plurality of first contact holes, between the plurality of spaced apart insulating gates, and recessed beneath the face of the first interlayer dielectric layer. A second dielectric layer then is conformally formed on the face of the first dielectric layer, on the sidewalls of the first contact holes and on the first recessed conductive layer in the first contact holes. At least a portion of the second dielectric layer is removed from on the first recessed conductive layer. A second conductive layer is formed in the first contact holes between the second dielectric layer on the sidewalls of the first contact holes. Thus, high aspect ratio contacts to the cell area may be provided.

Second contact holes then may be formed in the core area, extending through the second dielectric layer and the first dielectric layer. A third conductive layer then may be conformally formed on the second dielectric layer, on the second conductive layer and lining the second contact holes. Thus, conductive contacts for the core area and the cell area may be formed simultaneously.

A fourth conductive layer then may be formed on the third conductive layer in the second contact holes. A bit line then may be formed on the second conductive layer in a selected one of the first contact holes. The bit line extends onto the second dielectric layer adjacent the selected one of the first contact holes. The bit line is spaced apart from the second conductive layer in the first contact holes that are adjacent the selected one of the first contact holes. Thus, the likelihood of shorting between the bit line and a buried contact in the cell area may be reduced and preferably eliminated.

The third conductive layer preferably is formed by forming a conformal refractory metal layer on the second dielectric layer, on the second conductive layer and lining the second contact holes. A titanium nitride layer then may be formed on the refractory metal layer. Annealing is performed to form a silicide from the conformal refractory metal layer and the titanium nitride layer. The bit line preferably is formed by forming a tungsten layer on the silicide, forming a titanium nitride layer on the tungsten layer and etching the tungsten layer, the titanium nitride layer and the silicide to define the bit line.

The first recessed conductive layer and the second conductive layer preferably both comprise polysilicon and the fourth conductive layer preferably comprises metal. The first interlayer dielectric layer preferably comprises borophosphosilicate glass and the second dielectric layer preferably comprises plasma-enhanced tetraethylorthosilicate. However, other materials may be used.

Integrated circuit memory devices according to the invention comprise a cell area and a core area. A first interlayer dielectric layer is provided on the cell area and on the core area including on a plurality of spaced apart insulated gates in the cell area. The first interlayer dielectric layer includes therein a plurality of first contact holes having sidewalls that extend from a face of the first interlayer dielectric layer through the first interlayer dielectric layer. The first contact holes further extend between the plurality of spaced apart insulated gates. A second dielectric layer is provided on the face of the first interlayer dielectric layer and on the sidewalls of the first contact holes. A first conductive layer is provided in the plurality of first contact holes between the plurality of spaced apart insulated gates and between the second dielectric layer on the sidewalls of the first contact holes.

A plurality of second contact holes are provided in the core area, extending through the second dielectric layer and the first interlayer dielectric layer. A second conformal conductive layer is provided on the second dielectric layer, on the second conductive layer and lining the second contact holes. A third conductive layer is provided on the second conductive layer in the second contact holes. Finally, a bit line is provided on the first conductive layer in a selected one of the first contact holes. The bit line extends onto the second dielectric layer adjacent the second one of the first contact holes. The bit line is spaced apart from the first conductive layer in the first contact holes that are adjacent the selected one of the first contact holes. Accordingly, improved integrated circuit memory devices and fabrication processes may be provided that can form high aspect ratio contacts notwithstanding large topography differences, and that can allow simplified processing and improved reliability.

DETAILED DESCRIPTION OF PREFERRED EMBODIMENTS

Figure 1:
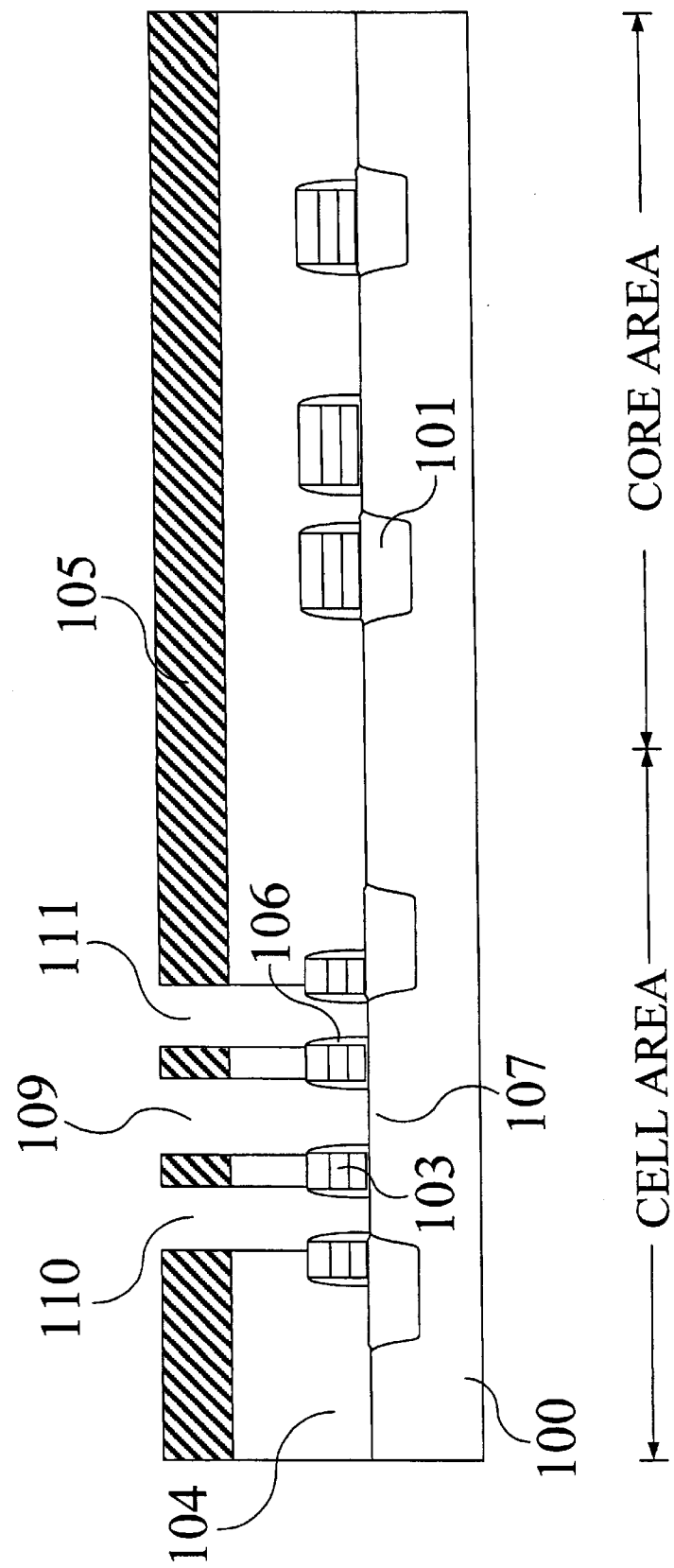
FIGS. 1–8 are cross-sectional views of integrated circuit memory devices according to the present invention during intermediate fabrication steps.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

FIGS. 1–8 are cross-sectional views of integrated circuit memory devices according to the present invention during intermediate fabrication steps. As shown in FIG. 1, an integrated circuit memory device includes a cell area and a core area that are defined in an integrated circuit substrate such as a silicon semiconductor substrate 100. A plurality of spaced apart insulated gates 103, also referred to as "gate stacks" are included in the cell area. The gates may include a sidewall spacer 106, such as a silicon nitride sidewall spacer, on the sidewalls thereof. Active regions 107 and device isolation regions 101 also may be included in the integrated circuit substrate 100. The fabrication of integrated circuit memory devices as described above is well known to those having skill in the art and need not be described further herein.

Still referring to FIG. 1, a first interlayer dielectric layer 104 is formed on the cell area and on the core area, including on the plurality of spaced apart insulated gates 103. The first interlayer dielectric layer 104 on the gates 103 can be planarized using an etch-back process, a chemical mechanical polishing process and/or other conventional techniques. A photoresist layer 105 is formed on the first interlayer dielectric layer 104. Dry etching then may be used to form a plurality of first contact holes 109, 110 and 111. As shown in FIG. 1, the plurality of first contact holes 109, 110 and 111 have sidewalls that extend from the outer face of the first interlayer dielectric layer 104 through the first interlayer dielectric layer 104 and between the plurality of spaced apart insulated gates 103, more specifically between the gate sidewall spacers 106. Thus, the plurality of first contact holes can expose active areas 107 of the integrated circuit substrate 100.

In a preferred embodiment for the first interlayer dielectric layer 104, a borophosphosilicate glass (BPSG) can be deposited. The BPSG glass can then be reflowed and further planarized using chemical mechanical polishing.

Figure 2:
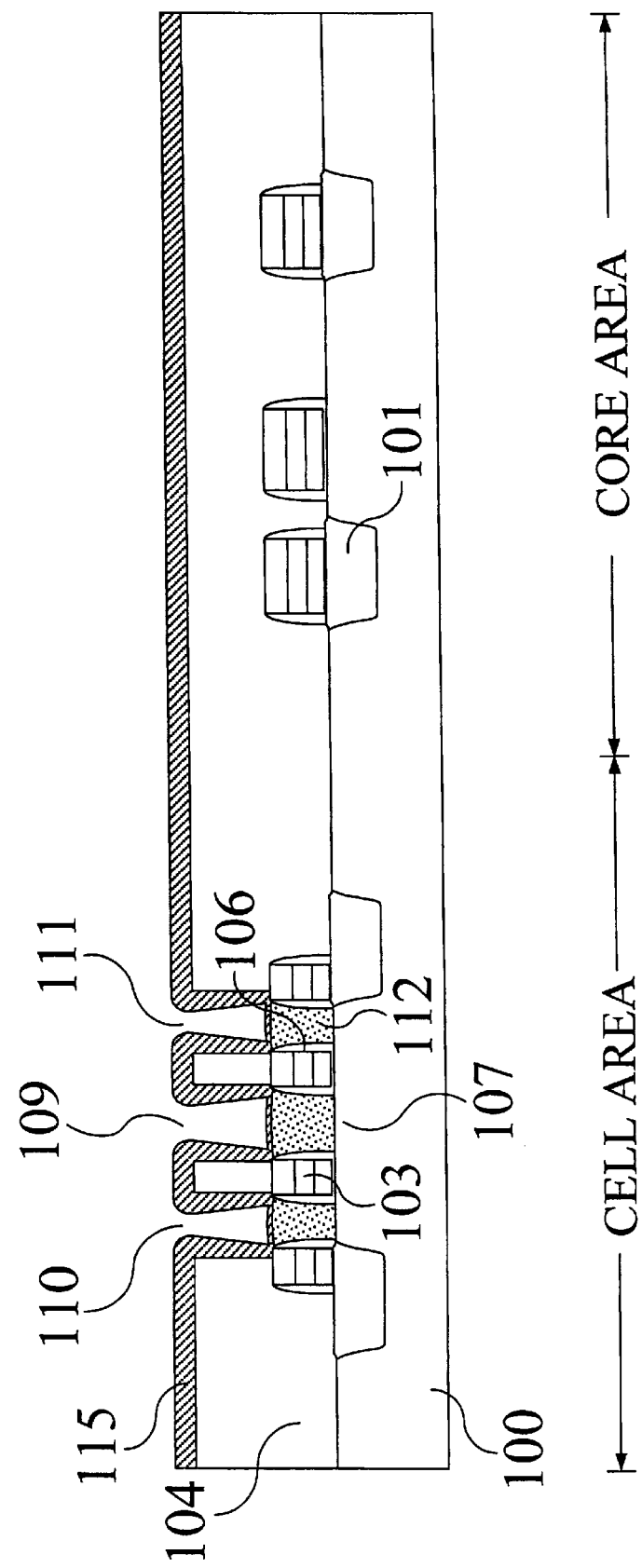

Referring now to FIG. 2, the photoresist layer 105 is removed and a first recessed conductive layer 112 is formed in the plurality of contact holes 109, 110 and 111, between the plurality of spaced apart insulated gates 103 and recessed beneath the outer face of the first interlayer dielectric layer 104. The first recessed conductive layer 112 preferably comprises doped polysilicon. The first recessed conductive layer 112 preferably is formed by blanket forming a doped polysilicon layer on the integrated circuit substrate and then anisotropically etching in order to produce the first recessed conductive layer 112 beneath the face of the interlayer dielectric layer 104.

Continuing with the description of FIG. 2, a second dielectric layer 115 then is conformally formed on the face of the first dielectric layer 104, on the sidewalls of the first contact holes 109, 110 and 111, and on the first recessed conductive layer 112 in the first contact holes 109, 110 and 111. Preferably, the second dielectric layer 115 comprises plasma-enhanced tetraethylorthosilicate (PE-TEOS) having a thickness of about 70 nm when the diameter of the first contact holes are about 260 nm. The thickness of the PE-TEOS layer on the first recessed conductive layer 112 may be approximately 1/10 the thickness of the PE-TEOS film on the first interlayer dielectric layer 104. As an alternative to PE-TEOS, plasma-enhanced silicon nitride (PE-SiN) and/or plasma-enhanced silane (PE-SiH$_4$) may be used. (Inventor—Are these correct?)

Figure 3:
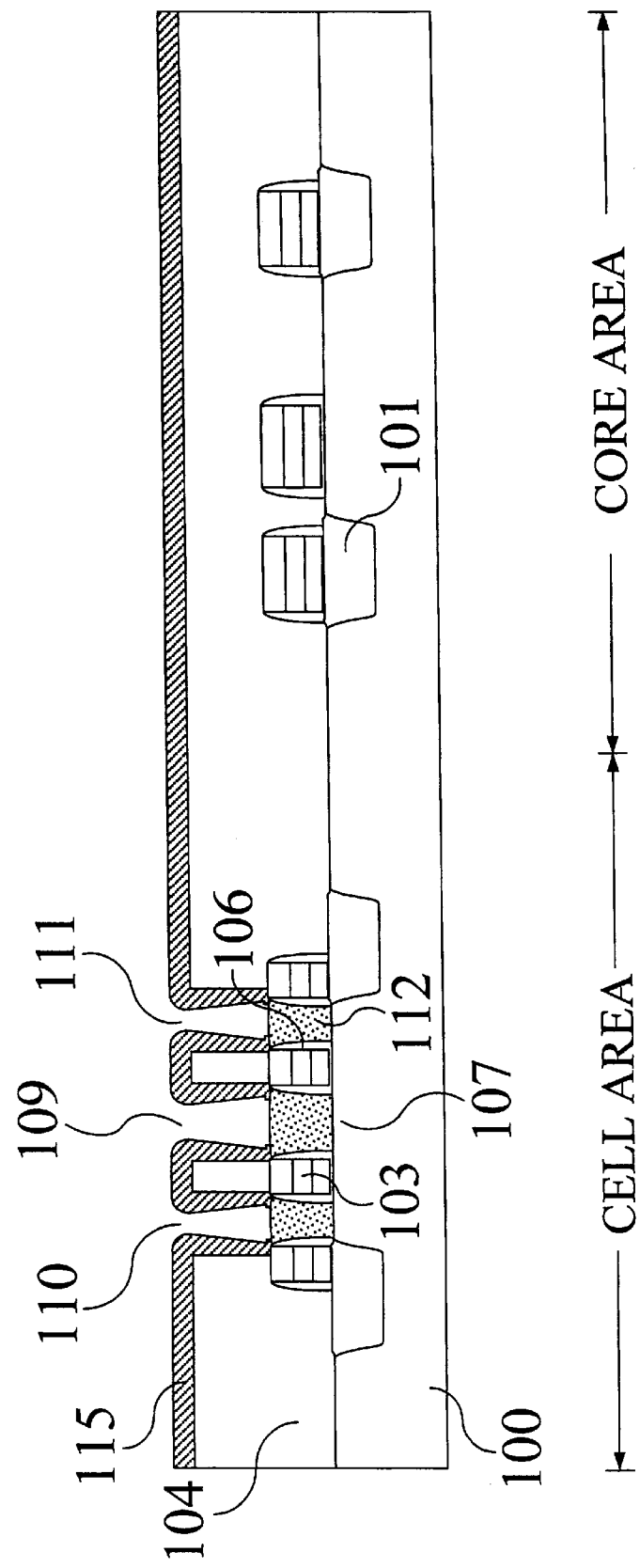

Referring now to FIG. 3 at least a portion of the second dielectric layer 115 is removed from on the first recessed conductive layer 112. More specifically, as shown in FIG. 3, the second dielectric layer 115 may be removed from on the first recessed conductive layer 112 to expose the first recessed conductive layer 112. Removal may take place using an etch-back process and/or other known techniques.

Figure 4:
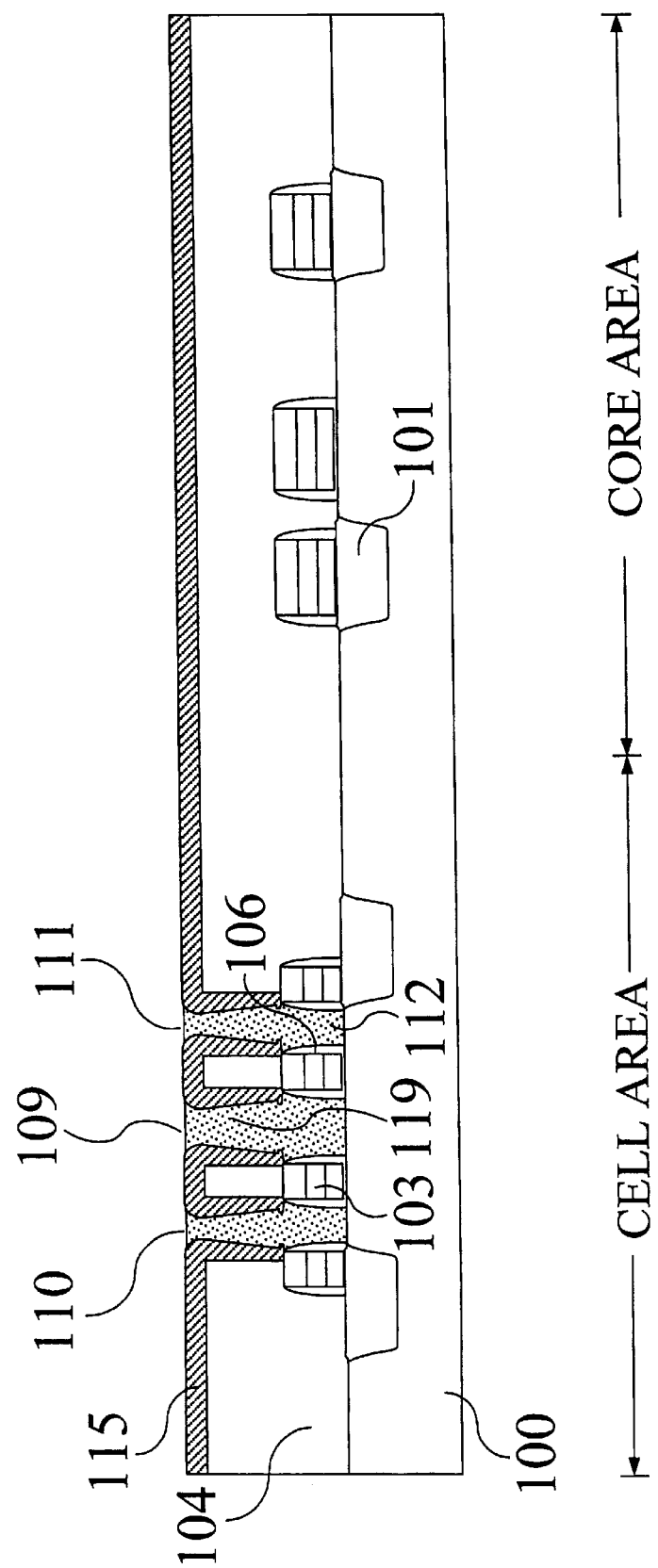

Referring now to FIG. 4, a second conductive layer 119 is formed in the first contact holes 109, 110 and 111 between the second dielectric layer 115 on the sidewalls of the first contact holes 109, 110 and 111. The second conductive layer 119 preferably comprises doped polysilicon similar to the first conductive layer 112 and may be formed by blanket-depositing doped polysilicon on the integrated circuit substrate and then etching back to planarize the surface of the cell area. Thus, the first and second conductive layers 112 and 119 preferably fill the first contact holes 109, 110 and 111 to form a plurality of polysilicon plugs in the cell area.

Figure 5:
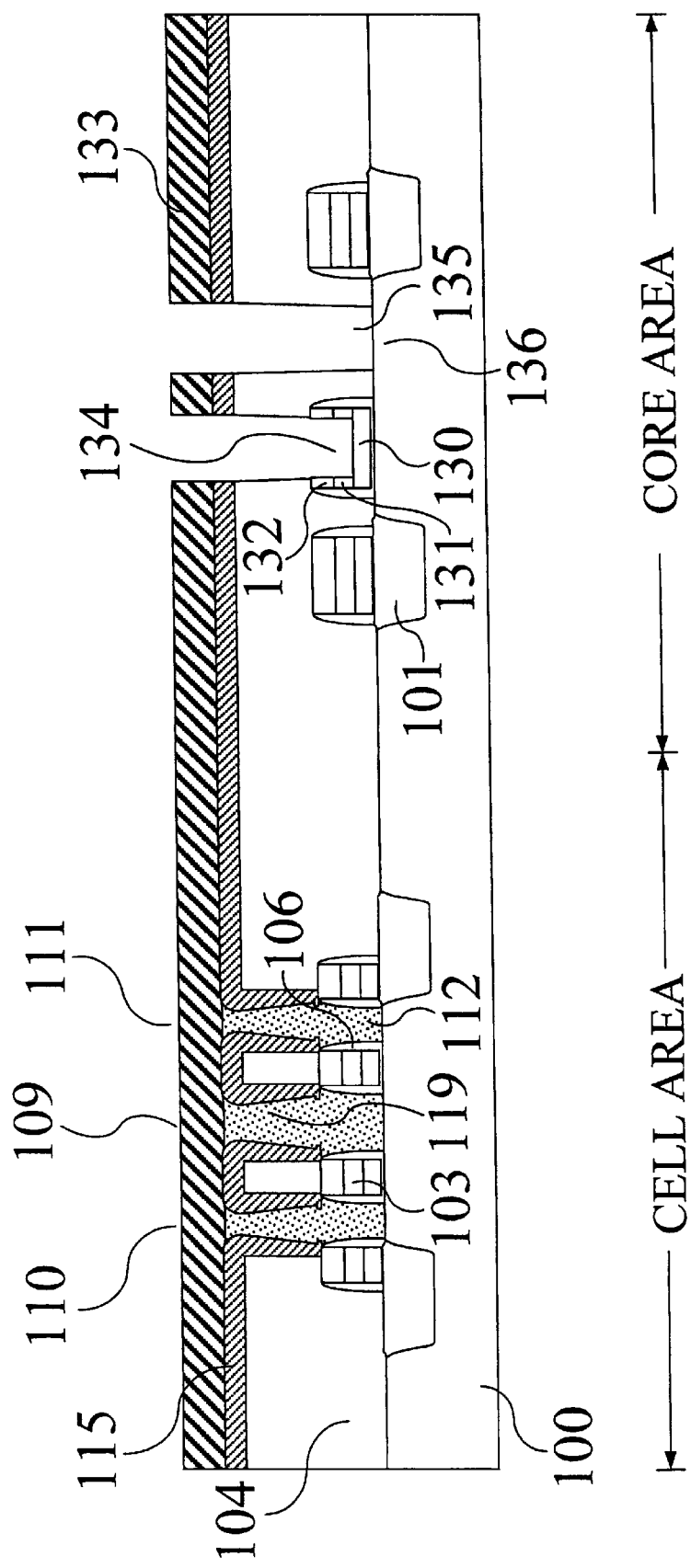

Referring now to FIG. 5, second contact holes 134 and 135 are formed in the core area, extending through the second dielectric layer 115 and the first dielectric layer 104. In particular, the contact hole 134 forms a direct contact to the gate 130 and the contact hole 135 contacts an active region 136 of the integrated circuit substrate 100. A photoresist layer 133 may be used to define the contact holes 134 and 135 using conventional photolithography. As also shown in FIG. 5, a contact window may be opened through a silicon nitride layer 132 and a tungsten silicide layer 131 on the gate 130.

Figure 6:
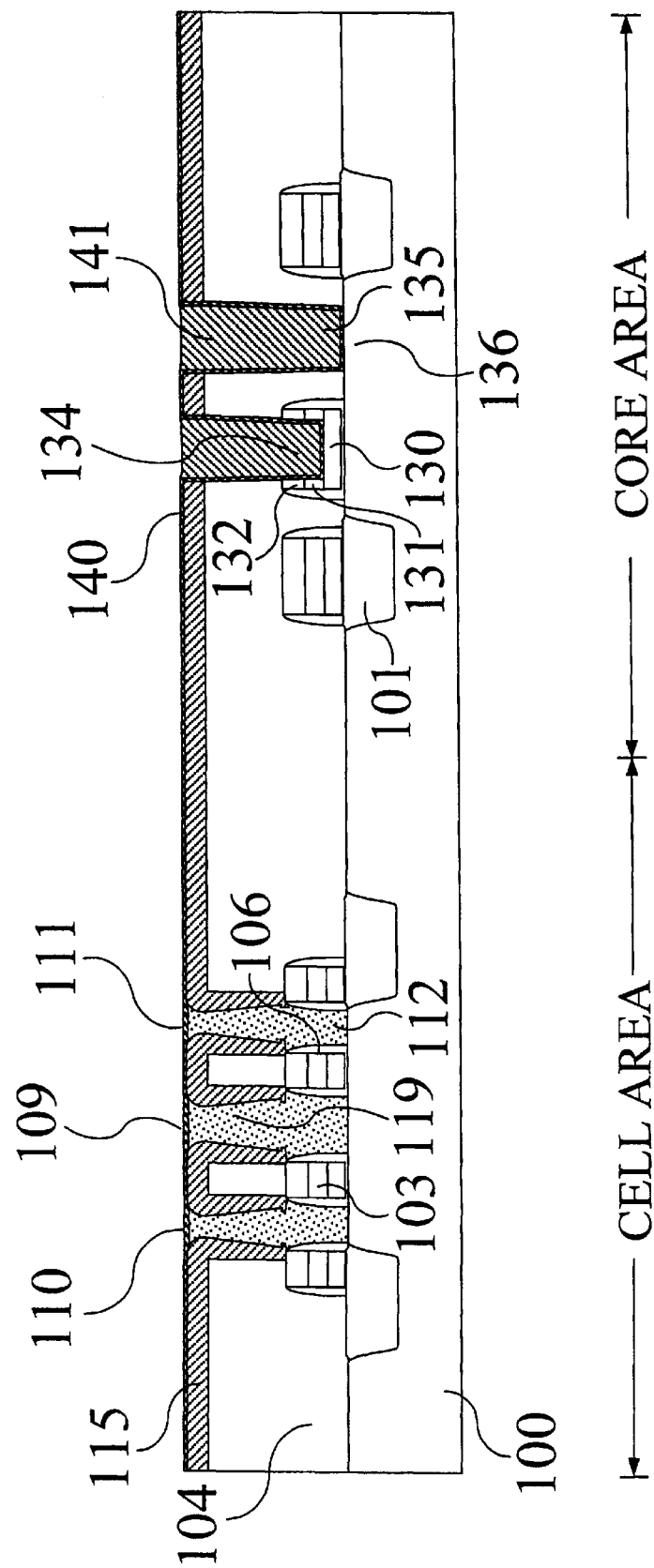

Referring now to FIG. 6, a third conductive layer 140 is conformally formed on the second dielectric layer 115, on the second conductive layer 119 and lining the second contact holes 134 and 135. The third conductive layer 140 preferably is a refractive metal silicide. The third conductive layer 140 may be formed by forming a conformal refractory metal layer on the second dielectric layer 115, on the second conductive layer 119 and lining the second contact holes 134 and 135. A titanium nitride (TiN) layer then may be formed on the refractory metal layer. The refractory metal layer preferably is titanium and/or cobalt. Annealing, preferably rapid thermal annealing (RTA) is performed, to thereby convert at least part of the refractory metal layer into a refractory metal silicide layer.

Still referring to FIG. 6, a fourth conductive layer then is formed on the third conductive layer 140 in the second contact holes 134 and 135. The fourth conductive layer preferably is a tungsten layer, and may be formed by blanket-depositing tungsten and then etching and/or chemical mechanical polishing to form tungsten plugs 141.

Figure 7:
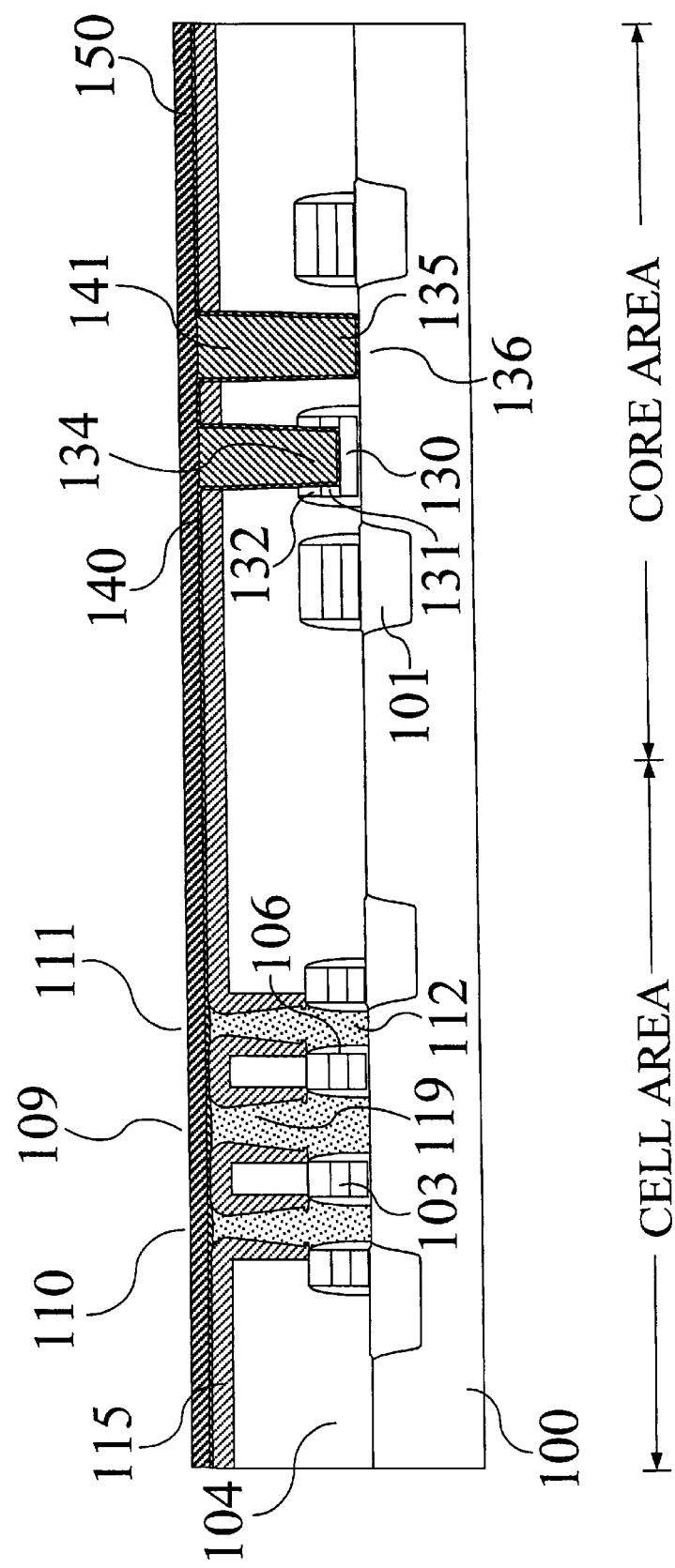

Referring now to FIG. 7, a fifth conductive layer 150, preferably comprising titanium nitride, is blanket-deposited on the third conductive layer and on the tungsten plugs 141.

Figure 8:
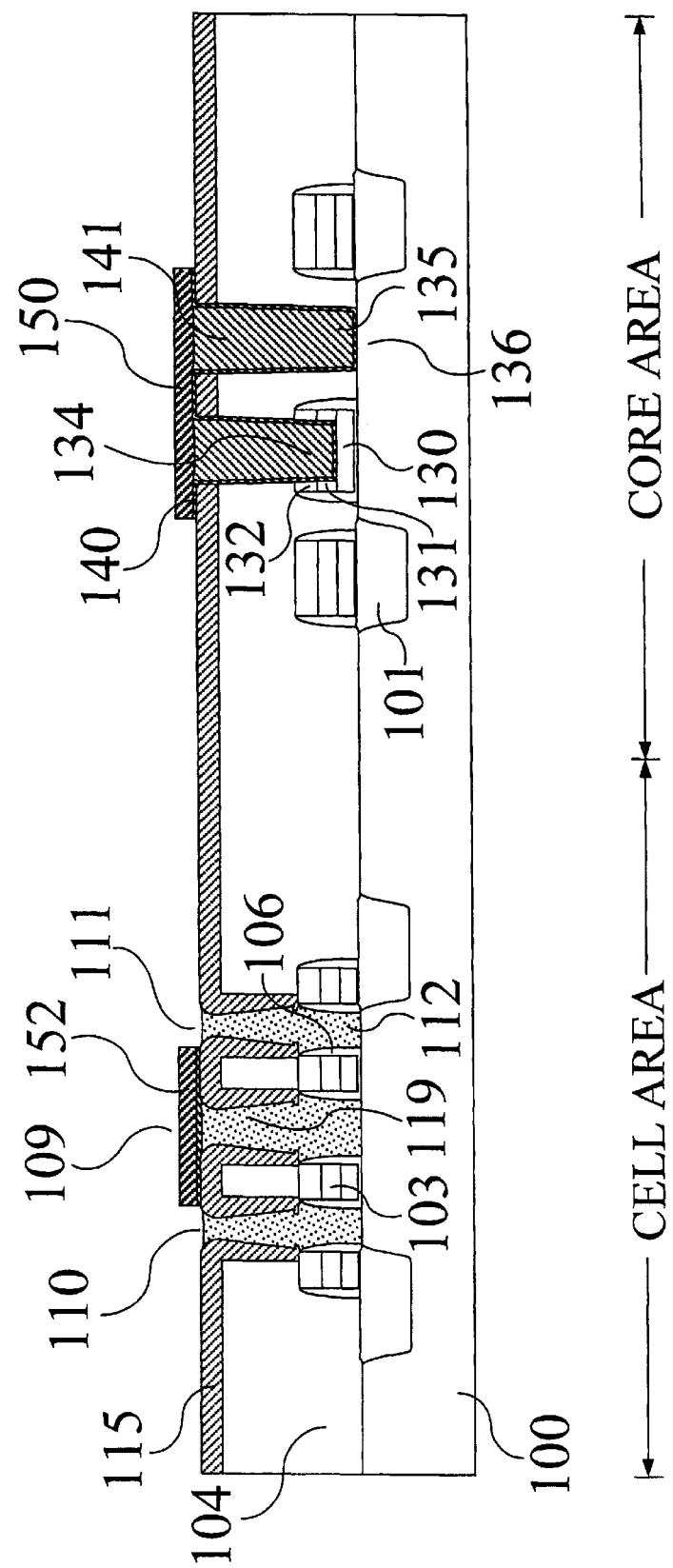

Then, referring to FIG. 8, the fifth conductive layer 150 and the third conductive layer 140 are patterned to define a bit line 152. In defining the bit line, the second conductive layer 119 also can be recessed in the second and third contact holes 110 and 111, to thereby reduce the likelihood of electrical shorts between the bit line 152 and the second conductive layer 119 in the second and third contact holes 110 and 111.

Figure 9:
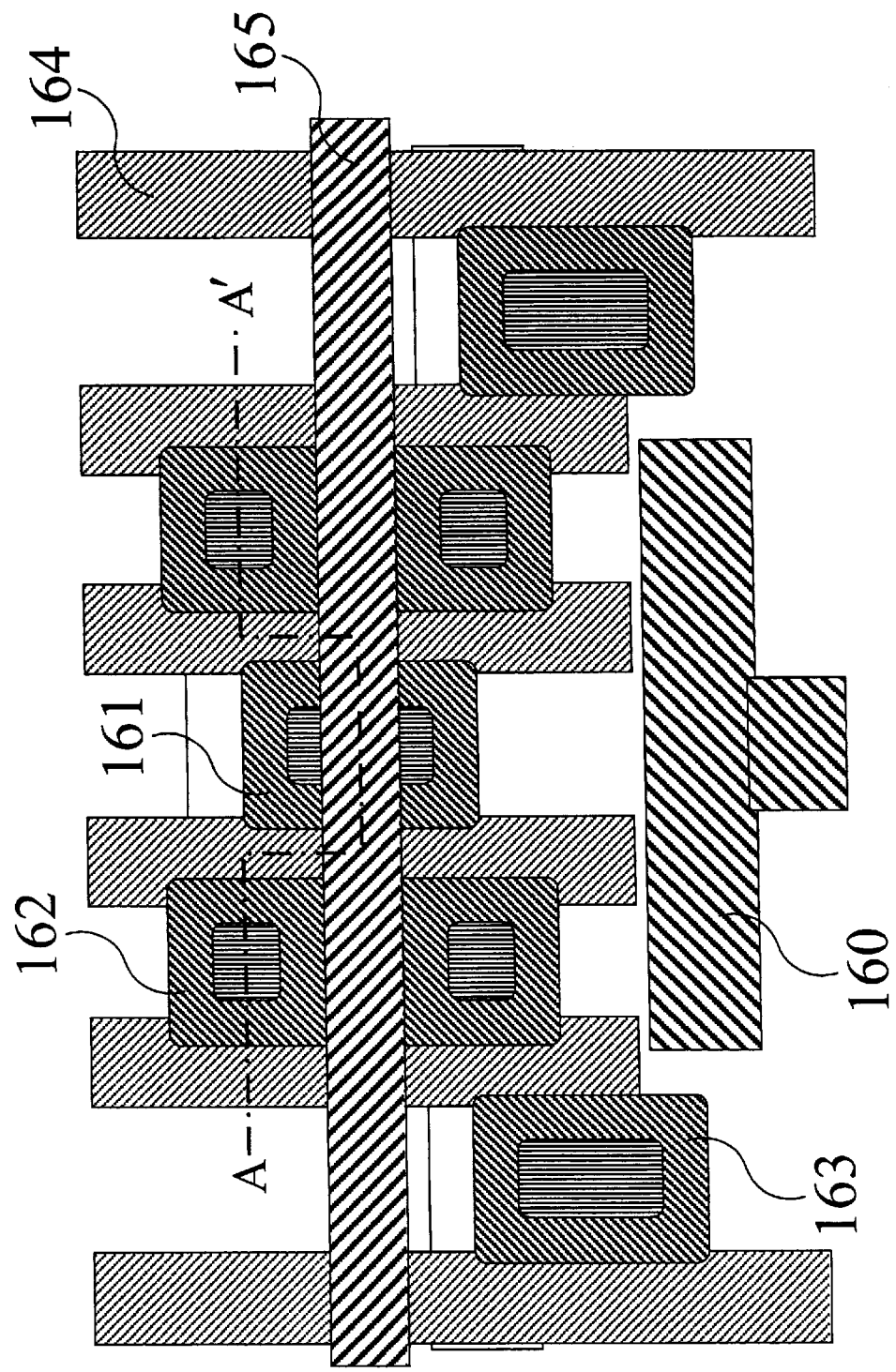
FIG. 9 is a top view of a contact pattern for integrated circuit memory devices according to the present invention.

FIG. 9 is a top view of a contact pattern of FIG. 8. FIG. 9 illustrates improvements of Critical Dimension (CD) margins that can be obtained according to the present invention. As shown in FIG. 9, CD margins of a T-shaped active region 160, the gate stack 164, a direct contact self-aligned contact 161, a buried contact self-aligned contact 162 and a self-aligned contact 163 with a small size relative to a bit line 165 are illustrated. An electrical short circuit between the buried self-aligned contact 162 and the bit line 165 also is illustrated in FIG. 9. The dotted line denoted by A–A' in FIG. 9 corresponds to the cross-sectional view of FIG. 8.

In the drawings and specification there have been disclosed typical preferred embodiments of the invention and although specific terms are employed, they are used in a generic and descriptive sense only and not for purposes of limitation, the scope of the invention being set forth in the following claims.

What is claimed is:

1. A method of fabricating conductive contacts to a cell area and to a core area of an integrated circuit memory device, the cell area including a plurality of spaced apart insulated gates, the method comprising the steps of:

forming a first interlayer dielectric layer on the cell area and on the core area, including on the plurality of spaced apart insulated gates, the first interlayer dielectric layer including therein a plurality of first contact holes having sidewalls that extend from a face of the first interlayer dielectric layer through the first interlayer dielectric layer, the first contact holes further extending between the plurality of spaced apart insulated gates;

forming a first recessed conductive layer in the plurality of first contact holes, between the plurality of spaced apart insulated gates, and recessed beneath the face of the first interlayer dielectric layer;

conformally forming a second dielectric layer on the face of the first dielectric layer, on the sidewalls of the first contact holes and on the first recessed conductive layer in the first contact holes;

removing at least a portion of the second dielectric layer from on the first recessed conductive layer;

forming a second conductive layer in the first contact holes between the second dielectric layer on the sidewalls of the first contact holes;

forming second contact holes in the core area, extending through the second dielectric layer and the first dielectric layer;

conformally forming a third conductive layer on the second dielectric layer, on the second conductive layer and lining the second contact holes;

forming a fourth conductive layer on the third conductive layer in the second contact holes; and forming a bit line on the second conductive layer in a selected one of the first contact holes, the bit line extending onto the second dielectric layer adjacent the selected one of the first contact holes, the bit line being spaced apart from the second conductive layer in the first contact holes that are adjacent the selected one of the first contact holes.

2. A method according to claim 1 wherein the step of conformally forming a third conductive layer further comprises the steps of:

forming a conformal refractory metal layer on the second dielectric layer, on the second conductive layer and lining the second contact holes;

forming a titanium nitride layer on the refractory metal layer; and annealing to form a silicide from the conformal refractory metal layer.

3. A method according to claim 2 wherein the step of forming a bit line further comprises the steps of:

forming a titanium nitride layer on the silicide; and etching the titanium nitride layer and the silicide to define the bit line.

4. A method according to claim 1 wherein the first recessed conductive layer and the second conductive layer both comprise polysilicon and wherein the fourth conductive layer comprises metal.

5. A method according to claim 1 wherein the first interlayer dielectric layer comprises borophosphosilicate glass and wherein the second dielectric layer comprises plasma enhanced tetraethylorthosilicate.

6. A method of fabricating conductive contacts to a cell area and to a core area of an integrated circuit memory device, the cell area including a plurality of spaced apart insulated gates, the method comprising the steps of:

forming a first interlayer dielectric layer on the cell area and on the core area, including on the plurality of spaced apart insulated gates, the first interlayer dielectric layer including therein a plurality of first contact holes having sidewalls that extend from a face of the first interlayer dielectric layer through the first interlayer dielectric layer, the first contact holes further extending between the plurality of spaced apart insulated gates;

forming a first recessed conductive layer in the plurality of first contact holes, between the plurality of spaced apart insulated gates, and recessed beneath the face of the first interlayer dielectric layer;

conformally forming a second dielectric layer on the face of the first dielectric layer, on the sidewalls of the first contact holes and on the first recessed conductive layer in the first contact holes;

removing at least a portion of the second dielectric layer from on the first recessed conductive layer; and forming a second conductive layer in the first contact holes between the second dielectric layer on the sidewalls of the first contact holes.

7. A method according to claim 6 further comprising the steps of:

forming second contact holes in the core area, extending through the second dielectric layer and the first dielectric layer; and conformally forming a third conductive layer on the second dielectric layer, on the second conductive layer and lining the second contact holes.

8. A method according to claim 7 further comprising the step of:

forming a fourth conductive layer on the third conductive layer in the second contact holes.

9. A method according to claim 8 further comprising the step of:

forming a bit line on the second conductive layer in a selected one of the first contact holes, the bit line extending onto the second dielectric layer adjacent the selected one of the first contact holes, the bit line being spaced apart from the second conductive layer in the first contact holes that are adjacent the selected one of the first contact holes.

10. A method according to claim 7 wherein the step of conformally forming a third conductive layer further comprises the steps of:

forming a conformal refractory metal layer on the second dielectric layer, on the second conductive layer and lining the second contact holes;

forming a titanium nitride layer on the refractory metal layer; and annealing to form a silicide from the conformal refractory metal layer.

11. A method according to claim 8 wherein the first recessed conductive layer and the second conductive layer both comprise polysilicon and wherein the fourth conductive layer comprises metal.

12. A method according to claim 6 wherein the first interlayer dielectric layer comprises borophosphosilicate glass and wherein the second dielectric layer comprises plasma enhanced tetraethylorthosilicate.

* * * * *